US005776540A

United States Patent [19]

Chadha et al.

[11] Patent Number: 5,776,540

[45] Date of Patent: Jul. 7, 1998

[54] PROCESS FOR MANUFACTURING A PRASEODYMIUM OXIDE- AND MANGANESE OXIDE-CONTAINING BASEPLATE FOR USE IN FIELD EMISSION DISPLAYS

[75] Inventors: Surjit S. Chadha, Meridian; Robert T. Rasmussen, Boise, both of Id.

[73] Assignee: Micron Display Technology, Inc., Boise, Id.

[21] Appl. No.: 777,797

[22] Filed: Dec. 31, 1996

Related U.S. Application Data

[62] Division of Ser. No. 645,615, May 14, 1996, Pat. No. 5,668,437.

[51] Int. Cl.$^6$ .............................. B05D 5/12; C23C 16/40; C23C 14/08

[52] U.S. Cl. .......................... 427/126.3; 427/70; 427/576; 427/584; 427/597; 427/255.3; 204/192.12; 313/336; 313/351

[58] Field of Search .................................... 427/126.3, 69, 427/70, 71, 255.3, 576, 584, 597; 204/192.12; 313/336, 351

[56] References Cited

U.S. PATENT DOCUMENTS

| | | | |
|---|---|---|---|
| 3,935,119 | 1/1976 | Barber et al. | 501/35 |
| 5,129,850 | 7/1992 | Kane et al. . | |
| 5,201,992 | 4/1993 | Marcus et al. | 156/643 |
| 5,319,279 | 6/1994 | Watanabe et al. . | |
| 5,455,489 | 10/1995 | Bhargava | 315/169.4 |
| 5,528,102 | 6/1996 | Gnade et al. . | |
| 5,534,749 | 7/1996 | Ohoshi et al. . | |
| 5,585,301 | 12/1996 | Lee et al. | 437/60 |
| 5,601,751 | 2/1997 | Watkins et al. | 427/64 |
| 5,616,061 | 4/1997 | Potter | 445/24 |

OTHER PUBLICATIONS

Matsuoka et al., "Black Pr–Mn Oxide Dielectric Material for AC Thin–Film Electroluminescent Display," *J. Electrochem Soc. 135(7)*:1836–1839, 1988.

*Primary Examiner*—Shrive Beck
*Assistant Examiner*—Bret Chen
*Attorney, Agent, or Firm*—Seed and Berry LLP

[57] ABSTRACT

A process for manufacturing a conductive and light-absorbing baseplate for use in a field emission display is disclosed. A surface of the baseplate is coated with a praseodymium oxide- and manganese oxide-containing layer having a resistivity that does not exceed $1\times10^5$ Ω-cm. The coating may be placed on the baseplate by radiofrequency sputtering, laser ablation, plasma deposition or the like. Suitable praseodymium sources include praseodymium acetate, praseodymium oxalate and $Pr(THd)_3$, while suitable manganese sources include $MnO_2$ and $MnCO_3$.

23 Claims, 1 Drawing Sheet

PROCESS FOR MANUFACTURING A PRASEODYMIUM OXIDE- AND MANGANESE OXIDE-CONTAINING BASEPLATE FOR USE IN FIELD EMISSION DISPLAYS

CROSS-REFERENCE TO RELATED APPLICATION

This application is a division of U.S. patent application Ser. No. 08/645,615, filed May 14, 1996 now U.S. Pat. No. 5,668,437.

This invention was made with Government support under Contract No. DABT63-93-C-0025 awarded by Advanced Research Projects Agency (ARPA). The Government has certain rights in this invention.

TECHNICAL FIELD

This invention relates generally to field emission displays and, more particularly, to a conductive, light-absorbing praseodymium-manganese oxide layer deposited on the surface of a baseplate within a field emission display to bleed off surface charge and absorb stray electrons.

BACKGROUND OF THE INVENTION

Many devices such as computers and televisions require the use of a display. Typically, the cathode ray tube (CRT) has been used to perform this function. The CRT consists of a scanning electron gun directed toward a phosphor-coated screen. The electron gun emits a stream of electrons that impinge upon individual phosphor picture elements or pixels on the screen. When the electrons strike the pixels, they cause the energy level of the phosphor to increase. As the energy level declines from this excited state, the pixels emit photons. These photons pass through the screen to be seen by a viewer as a point of light. The CRT, however, has a number of disadvantages. In order to scan the entire width of the screen, the CRT screen must be relatively distant from the electron gun. This makes the entire unit large and bulky. The CRT also requires a significant amount of power to operate.

More modern devices such as laptop computers require a light weight, portable screen. Currently, such screens use electroluminescent or liquid crystal display technology. A promising technology to replace these screens is the field emission display. The field emission display (FED) utilizes a baseplate of cold cathode emitter tips as a source of electrons in place of the scanning electron gun used in the CRT. When placed in an electric field, these emitter tips emit a stream of electrons in the direction of a faceplate to which phosphor pixels are adhered. Instead of a single gun firing electrons at the pixels, the FED has an array of emitter tips. Each of the emitter tips are individually addressable, and one or more of the emitter tips correspond to a single phosphor pixel on the faceplate.

One of the problems associated with an FED is that not all of the photons that are released from the pixels pass through the faceplate to be seen by the viewer as points of light. Rather, nearly half of the photons will proceed in the general direction of the baseplate, and may impinge upon the emitter tips and/or circuitry within the FED. This may cause an undesirable photoelectric effect, and any reflected light from the baseplate reduces the contrast of the FED. A further problem is that not all of the electrons released by the emitter tips actually excite their targeted pixel. Instead, some of these electrons are reflected internally, and may excite a non-targeted pixel.

Accordingly, there is a need in the art for a field emission display which minimizes the photoelectric effect, and the problems associated with internally-reflected electrons. The present invention fulfills these needs, and provides other related advantages.

SUMMARY OF THE INVENTION

In brief, this invention is generally directed to a conductive, light absorbing praseodymium-manganese oxide layer coated on the interior surface of an FED baseplate. The praseodymium-manganese oxide layer reduces the photoelectric effect and damage associated by reflected electrons from the faceplate, and improves display image and contrast due to absorption of any ambient light reaching the baseplate and/or by absorption of any photons emitted in the direction of the baseplate.

In one embodiment, a conductive and light-absorbing baseplate for use in a field emission display is disclosed. At least a portion of the interior surface of the baseplate (i.e., the surface opposite the faceplate) is coated with a praseodymium-manganese oxide layer having a resistivity which does not exceed $1\times10^5$ Ω-cm, preferably does not exceed $1\times10^4$ Ω-cm, and more preferably does not exceed $1\times10^3$ Ω-cm. The praseodymium-manganese oxide layer is coated on the baseplate at a thickness ranging from 1,000 Å to 15,000 Å, and has a light absorption coefficient of at least $1\times10^5$ $cm^{-1}$ at a wavelength of 500 nm.

In a related embodiment, an FED is disclosed which contains the conductive and light-absorbing baseplate of this invention. Such displays are particularly suited for use in products which are employed under high ambient light conditions, including, but not limited to, the screen of a laptop computer.

In a further embodiment, a process for manufacturing a conductive and light-absorbing baseplate is disclosed. The process includes coating the interior surface of the baseplate with a layer of praseodymium-manganese oxide having a resistivity which does not exceed $1\times10^5$ Ω-cm. Suitable coating techniques include (but are not limited to) deposition by RF sputtering.

In still a further embodiment, a process for manufacturing a conductive and light-absorbing praseodymium-manganese oxide material is disclosed. This process includes heating a mixture of a praseodymium compound and a manganese compound at a temperature ranging from 1200°–1500° C. for a period of time sufficient to yield the praseodymium-manganese oxide material. The praseodymium compound is $Pr_6O_{11}$ and the manganese compound is selected from $MnO_2$ and $Mn(CO_3)_2$. Furthermore, the ratio of praseodymium to manganese within the praseodymium-manganese oxide material is such that the material has a resistivity, after coating a layer of the same on the baseplate, that does not exceed $1\times10^5$ Ω-cm.

These and other aspects of this invention will become evident upon reference to the attached figures and the following detailed description.

DETAILED DESCRIPTION OF THE INVENTION

As mentioned above, the present invention is directed to a conductive, light absorbing praseodymium-manganese oxide layer for use within an FED. This layer serves to bleed off surface charge associated with stray electrons within the FED, and must have a resistivity no greater than $1\times10^5$ Ω-cm, preferably no greater than $1\times10^4$ Ω-cm, and more preferably no greater than $1\times10^3$ Ω-cm. Furthermore, the praseodymium-manganese oxide layer also serves to absorb back-emitted photons (i.e., photons emitted from the faceplate in the direction of the baseplate). Due to its very dark color, the praseodymium-manganese oxide layer readily absorbs light (i.e., the light absorption coefficient of praseodymium-manganese oxide is on the order of $1\times10^5$ $cm^{-1}$), which provides a number of benefits to the FED. One of these benefits is that it minimizes the photoelectric effect in the underlying circuitry due to stray photons striking the baseplate of the FED. A further beneficial property is that it provides better contrast between the emitted light and the ambient background reflection from the cathode surface.

Figure 1:
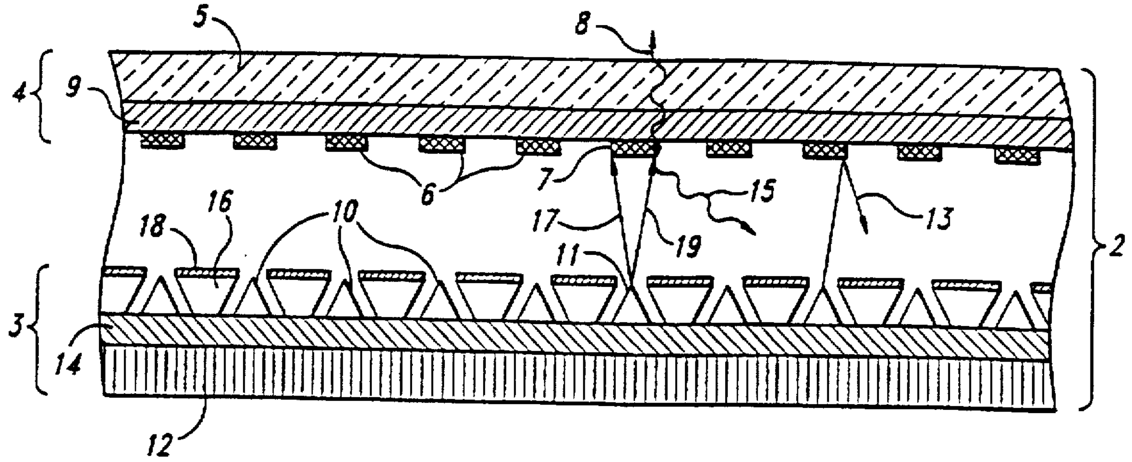
Fig. 1 (Prior Art)
FIG. 1 is a cross-sectional view of a prior art field emission display screen, and illustrates both emitted and back-emitted photons, as well as internally-reflected electrons.

The problems associated with existing FED screens are illustrated by reference to the prior art screen of FIG. 1. Specifically, FIG. 1 is a cross-sectional view of an FED screen 2 which is comprised of baseplate 3 and faceplate 4. Faceplate 4 includes an array of pixels 6 in contact with conductive layer 9, which in turn is in contact with a transparent material 5. Baseplate 3 includes an array of emitter tips 10 which protrude from a silicon substrate 12. A conductive layer 14 contacts the emitter tips to an addressing scheme (not shown) that selectively connects each of the emitter tips to a power supply (not shown). An insulating layer 16 surrounds each of the emitter tips 10. A conductive gate 18 also surrounds the emitter tips and is separated from conductive layer 14 and substrate 12 by insulating layer 16. Conductive grid 18 is connected to the positive terminal of a power supply through a similar addressing scheme (not shown) as that of the emitter tips. When a particular emitter tip is addressed, such as emitter tip 11 in FIG. 1, an electric field is placed between the appropriate conductive gate and emitter tip. This electric field causes emitter tip 11 to release a stream of electrons, represented by arrows 17 and 19, toward pixel 7 located on faceplate 4.

For purpose of clarity, FIG. 1 depicts a single pixel corresponding to each emitter tip. However, it should be recognized that more than one emitter tip may be associated with a single pixel. Furthermore, the distance between faceplate 4 and baseplate 3 may be fixed by use of suitable supporting elements (not shown), and faceplate 4 and baseplate 3 are sealed along their edges and a high vacuum, for example, $1\times10^{-5}$ to $1\times10^{-8}$ torr, is maintained therein.

When an electron (as depicted by arrow 19 of FIG. 1) strikes phosphor pixel 7, the phosphor is elevated to an excited state and emits photon 8 as it drops back to a ground state. Photon 8 is seen by the viewer as a point of light. However, it is equally likely that the photon will be released back toward baseplate 3, as represented by photon 15. In this instance, photon 15 may create a photoelectric effect which leads to undesirable electrons and holes in the components of baseplate 3.

FIG. 1 also illustrates a further problem associated with existing FED screens. Rather than exciting the phosphor pixel causing release of photons, electrons directed to a targeted pixel may be reflected, scattered or absorbed by the pixel. Some of these reflected electrons (as depicted by arrow 13 of FIG. 1) and/or those produced by secondary emissions may travel back in the direction of baseplate 3, again resulting in unwanted electrons and producing holes in baseplate 3.

Figure 2:
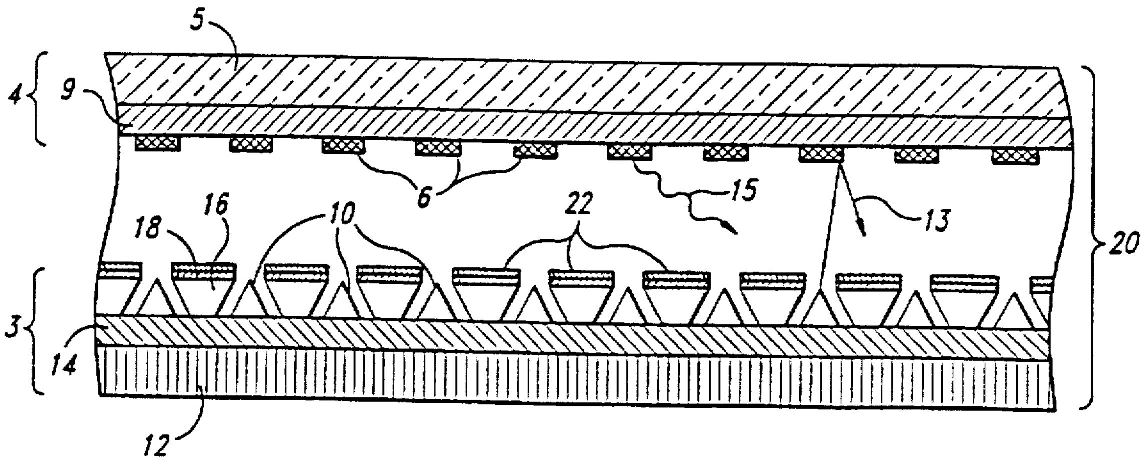
FIG. 2 is a cross-sectional view of a representative field emission display of this invention.

The present invention overcomes the above problems by employing a baseplate having a layer of praseodymium-manganese oxide upon the interior surface of the baseplate, that is, the surface opposite the faceplate. As illustrated in FIG. 2, an FED screen 20 of this invention contains faceplate 4 and baseplate 3. A praseodymium-manganese oxide layer 22 is in contact with conducting gate 18 which, in turn, is in contact with insulating layer 16 on conductive layer 14 and substrate 12. Emitter tips 10 and faceplate 4 (containing pixels 6, conductive layer 9 and transparent material 5) are the same as described above for FIG. 1.

When a photon (as depicted by arrow 15 in FIG. 2) strikes praseodymium-manganese oxide layer 22 it is absorbed, thus obviating the photoelectric effect and improving contrast of the FED. Electrons that are reflected back toward baseplate 3 (as depicted by arrow 13 in FIG. 2) also impinge upon by the praseodymium-manganese oxide layer. Because the praseodymium-manganese oxide layer 22 is conductive, captured electrons are discharged through the conductivity gate 18 when the conductivity gate 18 is positively biased. Alternatively, if the praseodymium-manganese oxide layer 22 is electrically isolated from the conductivity gate 18, for example, by an intermediate insulative layer (not shown), the praseodymium-manganese oxide layer 22 could be grounded. In any event, the praseodymium-manganese oxide layer sharply reduces the number of electrons that impinge on components of baseplate 3, thus eliminating undesirable electron holes therein.

Accordingly, in one embodiment of this invention, a praseodymium-manganese oxide material is disclosed which is suitable for depositing upon the interior surface of a baseplate of an FED. The praseodymium-manganese oxide material may be represented by the formula $Pr:Mn:O_3$, wherein the molar ratio of praseodymium to manganese (Pr:Mn) may generally range from 0.1:1 to 1:0.1, and preferably from 0.5:1 to 1:0.5. This molar ratio has been found to yield suitable conductivity for the resulting praseodymium-manganese oxide layer. Furthermore, by increasing the amount of manganese in relation to praseodymium, conductivity is increased (i.e., resistivity is decreased).

The praseodymium-manganese oxide material may be made by combining $Pr_6O_{11}$ with $MnO_2$ or $MnCO_3$ in a mill jar, and milling the same to a powder containing particles having an average diameter of approximately 2 μm. This powder is then heated at a temperature ranging from 1200°–1500° C., preferably from 1250°–1430° C., for about 4 hours. After heating, the resulting material is very dark colored, essentially matte black. The heated material may then be re-crushed and milled to again yield a powder having an average particle diameter of about 2 μm.

As mentioned above, the ratio of Pr to Mn influences the conductivity of the resulting praseodymium-manganese oxide layer. Such a ratio may be controlled by the relative amounts of the components $Pr_6O_{11}$ and $MnO_2$ or $MnCO_3$. Thus, these components are mixed in amounts sufficient to yield the Pr:Mn ratio disclosed above.

The praseodymium-manganese oxide material may be deposited on the interior surface of the baseplate by any number of techniques to a thickness ranging from 1,000 Å to 15,000 Å. Such deposition techniques are known to those skilled in this field, and include, but are not limited to, radio frequency (RF) sputtering, laser ablation, plasma deposition, chemical vapor deposition (CVD) and electron beam evaporation. For example, in the case of RF sputtering, the praseodymium-manganese oxide material is compressed to make a planar target, which is then mounted within a suitable backing plate for RF sputtering. Sputtering may then be carried out in an RF sputterer using argon or argon and oxygen gas, with a substrate temperature of 200°–350° C. and a sputtering pressure of about $6\times10^{-3}$ to about $3\times10^{-2}$ torr. With regard to CVD, organometallic precursors for Pr and Mn would be employed, such as Pr acetate, Pr oxalate or $Pr(Thd)_3$, as well as Mn acetate, Mn carbonyl, Mn methoxide and Mn oxalate.

The resistivity of the praseodymium-manganese oxide material may also be controlled by, for example, firing the material (after deposited as a layer on the interior surface of the baseplate, in a reducing atmosphere, such as hydrogen and/or carbon monoxide. Such treatment serves to increase conductivity, or in other words, reduce resistivity to levels suitable for use in the practice of this invention. Alternatively, additional components may be added to the material, such as conductive ions and/or metals, to further enhance conductivity.

The resulting praseodymium-manganese oxide layer on the interior surface of the baseplate shields the underlying circuitry from photons and stray electrons as discussed above. Since the praseodymium-manganese oxide layer is very dark colored, it also yields high contrast to the FED. Furthermore, an FED which employs the present invention possess high legibility under ambient lighting conditions, and are particularly suited for use as screens for televisions, portable computers and as displays for outdoor use, such as avionics and automobiles.

The following examples are presented for purpose of illustration, not limitation.

EXAMPLES

Example 1

Preparation of Praseodymium-Manganese Oxide Material $Pr_6O_{11}$ and $MnO_2$ were purchase from a commercial source (Cerac, La Puente, Calif.) and used without further purification. Both components were placed in a mill jar (510.72 grams $Pr_6O_{11}$ and 86.94 grams $MnO_2$), 500 ml of isopropyl alcohol was added, and the resulting slurry milled for 24 hours at 100 rpm. The slurry was dried in an oven under a nitrogen atmosphere. The dried material was fired at 1350° C. for 4 hours, and then cooled. The cooled material was ground to small particles (average diameter of about 2 μm) using a suitable grinding technique.

Example 2

Deposition of Praseodymium-Manganese Oxide Material on Baseplate

The resulting powdered material of Example 1 may be deposited on the baseplate by any of a variety of acceptable techniques. For example, in the case of RF sputtering, the powdered material may be sintered to form a planar sputter target. Sputtering may then be carried out in an RF sputterer using argon or argon and oxygen gas, with a substrate temperature of 200°–350° C., and a pressure of about $6\times10^{-3}$ to $3\times10^{-2}$ torr.

Example 3

Manufacture of an FED Screen

The baseplate of Example 2 may used in the manufacture an FED screen using known techniques. The resulting FED has a number of advantages over existing products, including: reduced photoelectric effect; reduced damage by reflected electrons from the faceplate to the baseplate components; and improved display image and contrast due to absorption of any ambient light reaching the baseplate and/or by absorption of any photons emitted by the faceplate in the direction of the baseplate.

From the foregoing it will be appreciated that, although specific embodiments of this invention have been described herein for the purpose of illustration, various modifications may be made without deviating from the spirit and scope of this invention. Accordingly, this invention is not limited except as by the appended claims.

We claim:

1. A process for manufacturing a conductive and light-absorbing baseplate for use in field emission display, comprising coating a surface of a baseplate with a layer comprising praseodymium oxide and manganese oxide, wherein the layer has a resistivity which does not exceed $1\times10^5$ Ω-cm.

2. The process of claim 1 wherein the layer has a resistivity which does not exceed $1\times10^4$ Ω-cm.

3. The process of claim 1 wherein the layer has a resistivity which does not exceed $1\times10^3$ Ω-cm.

4. The process of claim 1 wherein the layer has a thickness which ranges from 1,000 Å to 15,000 Å.

5. The process of claim 1 wherein the layer has a light absorption coefficient of at least $1\times10^5$ $cm^{-1}$ at a wavelength of 500 nm.

6. The process of claim 1 wherein the layer is coated on the surface of the baseplate by a coating process selected from the group consisting of radiofrequency sputtering, laser ablation, plasma deposition, chemical vapor deposition or electron beam evaporation.

7. The process of claim 1 wherein the layer is coated on the surface of the baseplate by radiofrequency sputtering.

8. The process of claim 7 wherein $Pr_6O_{11}$ and a manganese source selected from $MnO_2$ and $MnCO_3$ form a sputtering target for the radiofrequency sputtering.

9. The process of claim 1 wherein the layer is coated on the surface of the baseplate by chemical vapor deposition.

10. The process of claim 9 wherein a praseodymium source selected from the group consisting of praseodymium acetate, praseodymium oxalate and $Pr(THd)^3$ is used to form the layer.

11. The process of claim 9 wherein a manganese source selected from the group consisting of manganese acetate, manganese carbonyl, manganese methoxide and manganese oxalate is used to form the layer.

12. The process of claim 1 further comprising, after the coating step, the step of firing the layer under a reducing atmosphere to lower its resistivity such that it does not exceed $1\times10^4$ Ω-cm.

13. The process of claim 12 wherein the reducing atmosphere is formed of hydrogen, carbon monoxide or a mixture threreof.

14. The process of claim 1 wherein the layer further comprises a conductive ion.

15. The process of claim 1 wherein the layer further comprises a metal.

16. The process of claim 1 wherein the layer consists essentially of praseodymium oxide and manganese oxide.

17. The process of claim 1 wherein the layer is formed of particles with an average particle diameter of about 2 μm.

18. The process of claim 1 wherein the layer is in contact with a conducting gate.

19. The process of claim 1 wherein the layer is in contact with a insulative layer.

20. The process of claim 1 wherein the layer has a molar ratio of praseodymium to manganese ranging from 0.1:1 to 1:0.1.

21. The process of claim 20 where in the molar ratio ranges from 0.5:1 to 1:0.5.

22. The process of claim 1 wherein the layer further comprises $PrMnO_3$.

23. The process of claim 1 further comprising the step of assembling a field emission display utilizing the conductive and light-absorbing baseplate.

* * * * *